United States Patent [19]

Teich et al.

[11] Patent Number: 5,128,792
[45] Date of Patent: Jul. 7, 1992

[54] SELF-SYNCHRONIZING INFRA-RED COMMUNICATION SYSTEM

[75] Inventors: Rudor M. Teich, South Orange; Keith Guillaume, Edison, both of N.J.

[73] Assignee: Inncom International, Inc., Old Lyme, Conn.

[21] Appl. No.: 432,175

[22] Filed: Nov. 6, 1989

[51] Int. Cl.$^5$ ............................................. H04B 10/10
[52] U.S. Cl. ..................... 359/161; 375/23; 359/181; 359/158; 340/870.24
[58] Field of Search .................... 307/265; 328/58; 375/22, 23, 40; 340/870.24; 455/608; 359/158, 161, 181

[56] References Cited

U.S. PATENT DOCUMENTS

| | | | |
|---|---|---|---|
| 4,357,634 | 11/1982 | Chung | 375/23 |
| 4,399,564 | 8/1983 | Cowen | 455/608 |
| 4,430,652 | 2/1984 | Rothenbuhler | 375/23 |
| 4,644,563 | 2/1987 | Ohishi | 375/23 |
| 4,972,435 | 11/1990 | Ho | 375/23 |

Primary Examiner—Edward L. Coles, Sr.
Assistant Examiner—L. Pascal
Attorney, Agent, or Firm—Gottlieb, Rackman & Reisman

[57] ABSTRACT

A self-synchronizing infra-red communication system. The coding scheme involves transmitting a series of pulses, the separations between successive pulses representing the same data. Even though the separations between successive pulses all represent the same data, the separations are all different; it is this feature which allows for self-synchronization. Arrival times of successive pulses are recorded; the arrival times represent the receipt not only of transmitted pulses, but also of detected noise. The time differences between all arrival times (not only successive arrival times) are checked for consistency with predetermined allowable time-interval ranges which can separate successively transmitted pulses in a data sequence. When a sufficient number of such checks have been made, representing a sufficient degree of redundancy, it is possible to derive the data value represented by all of the pulse separations.

33 Claims, 2 Drawing Sheets

"LARGE" WINDOW LIMITS

| CASE j | Lj | Uj | N | INTERVAL |
|---|---|---|---|---|
| 7 | 3,968 | 4,992 | 1 | $P_1-S$ |
| 6 | 4,992 | 6,016 | 1 | $P_2-P_1$ |
| 5 | 6,016 | 7,040 | 1 | $P_3-P_2$ |
| 4 | 7,040 | 8,064 | 1 | $P_4-P_3$ |
| 3 | 8,960 | 11,008 | 2 | $P_2-S$ |
| 2 | 11,008 | 13,056 | 2 | $P_3-P_1$ |
| 1 | 13,056 | 15,104 | 2 | $P_4-P_2$ |

NOTES
1) PULSE ARRAY IS 10 DEEP.
2) $\Delta T = A_{10} - A_i$
3) OFFSET $= \Delta T - L_j$
4) $E = OFFSET/(64 \cdot N)$
5) E MUST BE AN INTEGER.
6) PULSES ARE TRANSMITTED WITH AN OFFSET OF 64(1+VALUE OF NIBBLE) $\mu$SEC.

| NIBBLE | VALUE | E |
|---|---|---|
| 0000 | 0 | 1 |
| 0001 | 1 | 2 |
| 0010 | 2 | 3 |
| 0011 | 3 | 4 |
| 0100 | 4 | 5 |
| 0101 | 5 | 6 |
| 0110 | 6 | 7 |
| 0111 | 7 | 8 |
| 1000 | 8 | 9 |
| 1001 | 9 | 10 |
| 1010 | 10 | 11 |
| 1011 | 11 | 12 |
| 1100 | 12 | 13 |
| 1101 | 13 | 14 |
| 1110 | 14 | 15 |
| 1111 | 15 | 16 |

"LARGE" WINDOW LIMITS

| CASE j | Lj | Uj | N | INTERVAL |
|---|---|---|---|---|
| 7 | 3,968 | 4,992 | 1 | $P_1-S$ |
| 6 | 4,992 | 6,016 | 1 | $P_2-P_1$ |
| 5 | 6,016 | 7,040 | 1 | $P_3-P_2$ |
| 4 | 7,040 | 8,064 | 1 | $P_4-P_3$ |
| 3 | 8,960 | 11,008 | 2 | $P_2-S$ |
| 2 | 11,008 | 13,056 | 2 | $P_3-P_1$ |
| 1 | 13,056 | 15,104 | 2 | $P_4-P_2$ |

NOTES
1) PULSE ARRAY IS 10 DEEP.
2) $\Delta T = A_{10} - A_i$
3) OFFSET = $\Delta T - L_j$
4) E = OFFSET/(64·N)
5) E MUST BE AN INTEGER.
6) PULSES ARE TRANSMITTED WITH AN OFFSET OF 64(1+VALUE OF NIBBLE) μSEC.

| NIBBLE | VALUE | E |
|---|---|---|
| 0000 | 0 | 1 |
| 0001 | 1 | 2 |
| 0010 | 2 | 3 |
| 0011 | 3 | 4 |
| 0100 | 4 | 5 |
| 0101 | 5 | 6 |
| 0110 | 6 | 7 |
| 0111 | 7 | 8 |
| 1000 | 8 | 9 |
| 1001 | 9 | 10 |
| 1010 | 10 | 11 |
| 1011 | 11 | 12 |
| 1100 | 12 | 13 |
| 1101 | 13 | 14 |
| 1110 | 14 | 15 |
| 1111 | 15 | 16 |

REQUIRED AGREEMENT FOR VALID NIBBLE

| LAST j | $E_7$ | $E_6$ | $E_5$ | $E_4$ | $E_3$ | $E_2$ | $E_1$ |
|---|---|---|---|---|---|---|---|
| 4 | X | E | E | E | | | |
| | E | X | E | E | | | |
| | E | E | X | E | | | |
| 5 | E | E | E | X | | | |
| 1 | E | E | E | | | | E |

SELF-SYNCHRONIZING INFRA-RED COMMUNICATION SYSTEM

This invention relates to infra-red communication systems, and more particularly to such systems which are self-synchronizing.

Infra-red communication is becoming commonplace. A sophisticated example of an infra-red communication system is disclosed in Teich, et al U.S. Pat. No. 4,850,040 which issued on July 18, 1989. In this system, a console located in a hotel room, for example, can operate a plurality of remote devices. Because infra-red transmission is best suited for point-to-point communication, the Teich et al system provides for the re-transmission of codes by a receiving device so that even receivers which are not in line-of-sight of the console can communicate with it.

It is known, however, that because of problems with transmitter/receiver alignment, signal loss over distance, the presence of obstacles, reflections and ambient light, and light and electromagnetic noise, errors in transmission not only occur, but they occur at much higher rates than they do in wired communication systems. Especially in a "diffused" system such as that of Teich et al, in which a transmitter should provide a semi-sphere of radiated infra-red energy so as to reach all points in a room, the dominant limitation on reliable communication is the signal-to-noise ratio. As a signal is reflected from numerous surfaces on its way from a transmitter to a receiver, the signal loses its power. Noise, on the other hand, becomes proportionally larger. The signal-to-noise ratio can be increased by increasing the power of the transmitter, but the total power is limited by the cost of the transmitting diodes and size considerations.

There are two ways to modulate infra-red energy—carrier modulation and baseband pulse modulation. The signal-to-noise ratio of carrier modulation is excellent due to the tuning at the front-end of a receiver and the use of a phase-locked loop which locks on the signal and cancels noise. But the power requirement is high. Baseband modulation, on the other hand, provides a lower signal-to-noise ratio, but the power requirement is very low because the average power can be a small fraction of the peak power. There are numerous other considerations which go into choosing which form of modulation to use, but pulse systems would be preferred if the noise immunity could be enhanced.

In impulse systems, data is commonly encoded using pulse position modulation. In almost all serial communication protocols, the start of transmission is the foundation on which a message is built and decoded. Unless a start condition is clearly recognized, the subsequent message cannot be decoded. A start pulse usually takes the form of the first infrared transmission after a period of quiet (no transmission). But if due to noise the receiver sees continuous infra-red activity, it may not recognize the start pulse. This is a particular problem with pulse position modulation systems where shot noise from fluorescent and other sources can mask the start of a message.

It is a general object of our invention to provide a method of transmitting and receiving data over an infra-red link which is self-synchronizing in that it is not necessary to identify a start pulse for proper decoding.

It is another object of our invention to provide a decoding scheme in which the number of required computations is minimized so that even a relatively slow microprocessor can perform the decoding as pulses arrive in real time.

The invention resides in the coding and how received pulses are decoded. Conventional hardware can be used for this purpose, and the above-identified Teich et al patent is hereby incorporated by reference as illustrating such hardware. The coding scheme involves transmitting a series of pulses, the separations between successive pulses representing the same data. Even though the separations between successive pulses all represent the same data, the separations are all different; it is this feature which allows for self-synchronization. Arrival times of successive pulses are recorded; the arrival times represent the receipt not only of transmitted pulses, but also of detected noise. The time differences between all arrival times (not only successive arrival times) are checked for consistency with predetermined allowable time-interval ranges which can separate successively transmitted pulses in a data sequence. When a sufficient number of such checks have been made, representing a sufficient degree of redundancy, it is possible to derive the data value represented by all of the pulse separations. [The coding scheme is error-correcting; incoming data can be reconstructed not only in the presence of noise, but even if parts of the data are lost.]

Further objects, features and advantages of our invention will become apparent upon consideration of the following detailed description in conjunction with the drawings, in which.

Figures 1, 2:
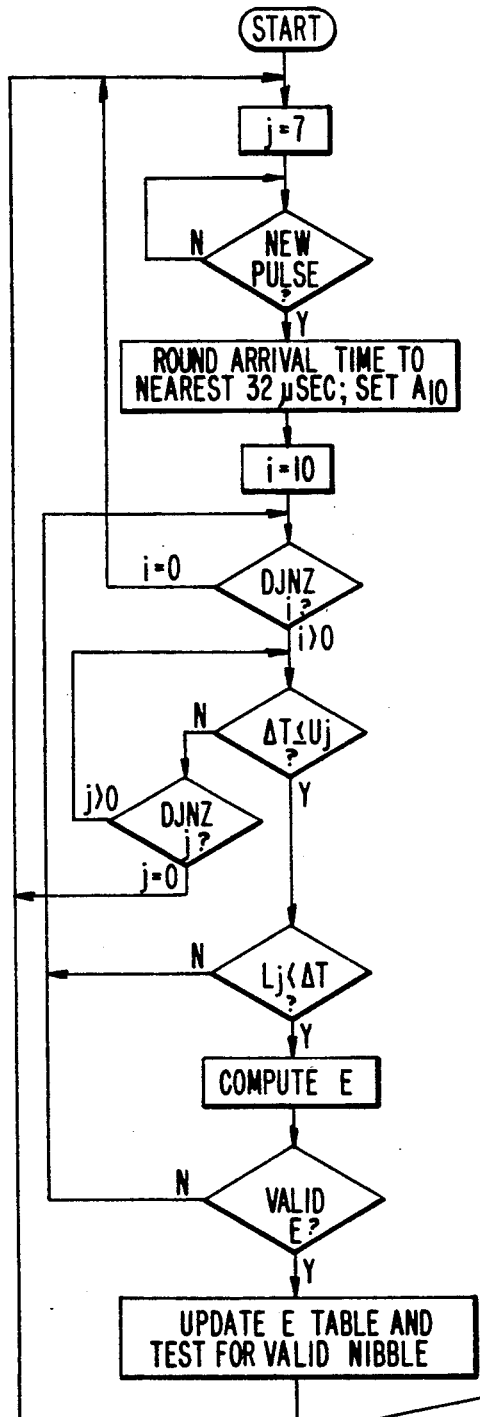
FIG. 1 depicts the first part of the illustrative embodiment of the decoding method of our invention in flow chart form, together with some notes and tables provided for explanatory purposes.
FIG. 2 is a table which represents certain requirements for valid decoding.

In the illustrative embodiment of the invention a 4-bit "nibble" consists of a start pulse followed by four pulses designated $P_1$ through $P_4$. Nibbles may follow each other in succession, with the start pulse, designated S, of any nibble thus actually being the last pulse, $P_4$, of the preceding nibble. Information is contained in the time intervals, or time separations, between pulses. Each pulse is six microseconds in width, although the width of a pulse is unimportant. The time intervals between successive pairs of pulses all represent the same one of sixteen possible values. In other words, all four intervals between successive pairs of pulses represent the same 4-bit data value.

The time interval between the start pulse and pulse $P_1$ is $(3,968+X)$ usec, where X is the product of the nibble value plus 1, multiplied by 64. Suppose, for example, that the nibble to be transmitted is 0101, the decimal value of which is 5. The value of X is thus $(5+1)(64)$, or 384, and the time separation between pulses S and $P_1$ is $3,968+384$, or 4,352 usec.

The time interval between pulses $P_1$ and $P_2$ is similarly derived, but the constant component is 4,992 usec, not 3,968. Similar remarks apply to the time intervals between pulses $P_2$ and $P_3$, and $P_3$ and $P_4$, with the respective constant time interval components being 6,016 and 7,040 usec. Thus for a nibble value of 0101, the four successive time intervals which separate the pulses in the nibble are 4,352, 5,376, 6,400 and 7,424 usec.

The four time interval ranges are non-overlapping. The offset, in microseconds, for all time intervals is $(1+X)(64)$, where X can range from 0 to 15. Thus the offset range is 64–1,024 usec. The total time-interval ranges, derived in each case by adding the constant part to the variable offset range, are thus 4,032–4,992, 5,056–6,016, 6,080–7,040 and 7,104–8,064 usec.

The traditional meaning of a nibble is a sequence of four bits which can represent one of the Hex values 0–F. We use the term nibble to refer to a sequence of four pulses. Strictly speaking, these pulses are not "bits" because the information content of one of our nibbles is contained in the time intervals between the pulses, a form of pulse position modulation. The four pulses which comprise our nibble represent four bits of information only by virtue of the fact that there are sixteen possible time intervals which can separate each successive pair of pulses. It is possible to provide a start pulse followed by five or even more pulses, all of the five or more time intervals between pulses still representing the same data value. Similarly, it is theoretically possible, although not preferred, to use a start pulse followed by fewer than four pulses. The point is that the invention is not limited in the number of pulses in each sequence which may follow a start pulse, nor is it limited in how many possible data values can be represented by the separation of every pair of successive pulses. As we use the term nibble, it is simply a sequence of pulses whose time separations may be different (and are different in the preferred embodiment of the invention because aperiodicity is preferred), but whose time intervals represent redundant information.

The object of the invention is to allow decoding even in the presence of noise, and even when it is not known which incoming pulse is a start pulse. In other words, the coding scheme allows for self-synchronization. It is expected that there will be noise pulses, especially additive noise pulses. In the illustrative embodiment of the invention, proper decoding takes place with up to 5 extra pulses appearing in any 5-pulse nibble (a start pulse S, followed by pulses $P_1$ through $P_4$). The decoding also works with one missing pulse.

The arrival times of successively received pulses are stored in a 10-position array. This buffer is of the first-in, first-out type. The arrival time of the most recent pulse is stored in position 10 of the array, and all of the previous pulse arrival times are pushed to adjacent lower-numbered positions in the array, with the oldest pulse being discarded.

After each pulse is received and its time of arrival is stored in position 10 of the 10-deep arrival-time array, the system determines whether that arrival time, relative to the other stored arrival times, corresponds to one of seven possible legitimate "cases" in which one pulse may follow another. Referring to the upper right corner of FIG. 1, the seven cases are listed. Case 7 is that for which it is assumed that the pulse which just arrived is pulse $P_1$ in a new nibble, and it followed a start pulse S (this pulse possibly being pulse $P_4$ in the preceding nibble). The time interval between a start pulse and pulse $P_1$ in any nibble is, as discussed above, 3,968 usec, plus 1 more than the value of the nibble multiplied by 64 usec. If the nibble value is 0000, then the $P_1$–S interval is, as indicated by note 6 in the figure, $3,968+64(1+0)$ or 4,032 usec. If the value of the nibble is the maximum, binary 1111, then the time interval is $3,968+64(1+15)$, or 4,992 usec. As indicated in the drawing for case 7, the upper limit for any legitimate interval $P_1$–S is 4,992 usec. The lower limit, although indicated to be 3,968 usec, is actually 64 usec greater than this value. However, all of the intervals processed in the illustrative embodiment of the invention are in increments of 64 usec, and the test whether the most recent interval falls within the lower and upper limits, $L_j$ and $U_j$, involves a test whether the interval is greater than $L_j$, or less than or equal to $U_j$. Thus although the values of 3,968 and 4,992 are shown as the "large" window limits for case 7, the actual lower limit (involving a "greater than" test") is 64 usec greater than that shown, i.e., 4,032 usec.

The chart shows a value N of 1 for case 7; the meaning of N will be explained below.

The next case to consider is that in which the pulse which just arrived is pulse $P_2$ of a nibble. Assuming that this pulse and a preceding pulse were both legitimate, the time interval between them corresponds to the $P_2$–$P_1$ interval. The constant component of this interval is 4,992 usec. Referring to note 6 on FIG. 1, the actual time intervals which can correspond to the $P_2$–$P_1$ interval, depending on the value of the nibble, are equal to the constant component plus 64 times (1 plus the value of nibble) usec. Thus the lower and upper limits indicated for the large window are 4,992 and 6,016 usec, it being understood once again that the large window test involves a "greater than" sub-test for the lower limit, so that the actual lower limit is 64 usec greater than the 4,992 usec indicated in the chart.

Case 5 is that in which the pulse just received corresponds to pulse $P_3$ of a nibble. The next case, case 4, corresponds to the time interval $P_4$–$P_3$, and the appropriate lower and upper limits are shown. For the four cases 7–4, the value of N is 1, for a reason to be described shortly. Throughout the discussion of window limits thus far, it has not been hypothesized that the immediately preceding pulse (whose arrival time is in position 9 of the arrival-time array) has to have been a legitimate nibble pulse. It may really have been noise. When it is assumed for "test" purposes, for example, that the arrival time of pulse $P_3$ is in position 10 of the array (which assumption itself may be wrong), it is assumed that the arrival time of pulse $P_2$ is somewhere in the array, but not necessarily in position 9. If the last pulse received was noise, the arrival time $A_{10}$ [value $A_{10}$ is contained in position 10] may very well be so low that the difference between it and arrival time $A_9$ will be less than the lowest lower window limit. Similarly, if a legitimate pulse was lost in transmission and the previously received pulse was the nibble pulse transmitted before the one just received, then the difference between values $A_{10}$ and $A_9$ will be larger than the highest upper limit for a pulse separation in the code. The system does not assume that the pulse which just arrived must be $P_1$, $P_2$, etc. The "large" window limits control seven tests to see whether the most recently entered time interval and any of the other nine can possibly correspond to one of the seven cases which can be handled.

Although what is stored in each position of the array is the arrival time of a pulse, the important parameters are the differences between various entries in the array, since the differences represent intervals between pulses. Of course, since absolute time grows indefinitely, each storage location would have to be infinitely long were absolute times recorded. Consequently, periodically, as all of the time values get too large, the same value can be subtracted from all of them, and this value can also be subtracted from whatever clock is used to record arrival times. In this way, the array will always represent relative values of time. That is permissible since all that matters are the relative arrival times of the pulses.

In the presence of noise, it may be that pulses $P_4$ and $P_3$ are actually represented in array positions 10 and 6, the intervening positions containing the arrival times of noise pulses. Thus the upper and lower limits for each case indicated in the upper table of FIG. 1 represent not a range of differences between adjacent entries in the array, but rather legitimate ranges of differences which may exist between the arrival time stored in position 10 of the array and the arrival time stored in any one of the other nine positions of the array. Thus the table represents window limits applicable to the most recent pulse, with it being understood that the preceding legitimate pulse can be stored in a position other than position 9 of the array.

The three other cases in the table correspond not to situations in which extra pulses have been detected, but rather to those in which a legitimate nibble pulse has been lost. The system can decode a nibble if any one of the pulses S, $P_1$, $P_2$ or $P_3$ is missing.

Consider case 3, corresponding to a missing pulse $P_1$. The question is what is the range of time intervals which can separate pulses S and $P_2$, with the arrival time of pulse $P_2$ being in position 10 of the array and the arrival time of pulse S being in one of the earlier positions. [Even though pulse $P_1$ may be missing, there can still be other noise pulses which were sensed, so the arrival time of pulse S may be in one of the low-numbered array positions.] The system, when considering case 3, checks whether the time interval represented by the difference between the value $A_{10}$ stored in the array and the value stored in one of the lower positions of the array falls within upper and lower limits for a $P_2$–S interval. The chart on FIG. 1 indicates that the lower limit is the sum of the lower limits for cases 6 and 7, while the upper limit is the sum of the upper limits for cases 6 and 7, since cases 6 and 7 "added" together would correspond to a time interval going from pulse S to pulse $P_2$. The actual lower and upper limits, however, are not quite the sums as shown in the chart, and it is for this reason that the value of N enters the picture.

According to note 2, the symbol Delta T is employed to represent the time difference between arrival time $A_{10}$ and any other arbitrary entry in the array, and it is assumed that this time difference corresponds to the time interval between some earlier legitimate pulse and the latest pulse to have arrived. According to note 3, the offset which is processed is equal to this Delta T, minus the lower limit in the table for the case under consideration. Note 4 depicts how the value of E is computed, where E equals the nibble value plus 1. The computed offset is divided by 64(N), where N is the value shown in the chart. For a nibble of value 0, and considering case 7 as an example, the Delta T derived by subtracting the value in some array position i from the value $A_{10}$ should be 64 usec plus the applicable $L_j$. The subtraction operation of note 3 produces the offset. The value of E is derived according to note 4 by dividing the offset by 64(N). Since N=1 for case 7, for a nibble value of 0, the computation results in E=1, the correct value.

Now consider the case in which the same data value of 0 is transmitted, but pulse $P_1$ is missing. The interval separating pulses S and $P_1$, at the transmitter, was (3,968+64) usec, and the interval separating pulses $P_1$ and $P_2$, at the transmitter, was (4,992+64) usec. The Delta T derived during the processing, the time difference between the arrival time of pulse $P_2$ stored in array position 10 and the arrival time of pulse S stored in some arbitrary position i, is (8,960+128) usec. Referring to the table for case 3, the case under consideration, Delta T is the sum of the two constant parts for cases 6 and 7, and also two offsets. The sum of the two equal offsets is derived, according to note 3, by subtracting $L_j$ (8,960 usec) from Delta T. Because N=2 for case 3, when dividing the total offset by 64(N) the result is once again E, in this case a value of 1 corresponding to a nibble value of 0.

Whatever the value of E computed for cases 3–1, the interval range represented in the table (the difference between the values stored in array position 10 and some other array position i for which Delta T falls within the large window limits for the case under consideration) will include two offsets within it. It is for this reason that during the processing, when looking for a time difference which corresponds with a missing pulse, in deriving the value of E in accordance with note 4 the denominator must be doubled by using a value of 2 for N.

Case 2 in the chart is that for which pulse $P_2$ is missing. Once again, the lower window limit is the sum of two earlier lower limits, this time those for cases 6 and 5; similar remarks apply to the upper limits. Finally, case 1 corresponds to a missing pulse $P_3$, the third case for which somewhere in the array there is an arrival time value which, when subtracted from the arrival time value in position 10, provides a Delta T which corresponds to a pulse $P_4$ having just arrived, with a pulse $P_2$ arrival time being stored somewhere in the array (together with the arrival times of noise pulses separating the two code pulses of interest) and pulse $P_3$ not having been detected.

The actual processing is shown in the flow chart of FIG. 1, and it is relatively simple to follow once the coding of a nibble, as described above, is understood. The basic approach is to wait until a new pulse arrives and to store its arrival time as entry $A_{10}$ in the array. That arrival time has subtracted from it the arrival time stored in each of the other nine positions of the array. Each of the nine possible time differences, Delta T, is checked to see if it falls within the "large" window limits of one of the seven cases represented in the table. The ranges for the seven cases are non-overlapping even though the upper limit for any case in the chart is the same as the lower limit for the next; the upper limit test involves a "greater than or equal" comparison while the lower-limit test involves a "greater than" comparison, so that any Delta T can fall in at most one of the seven ranges. As soon as a Delta T value is found which is within one of the seven window limit ranges, it is assumed that the pulse which was just received is at the end of the interval for the corresponding case in the chart. For example, if during the processing there is some Delta T which is greater than 6,016 usec and for which 7,040 usec is greater or equal, then it is assumed that the case being processed is case 5 and the last-received pulse is pulse $P_3$ of a nibble. [It does not matter which array position contains an arrival time (for pulse $P_2$) which gave rise to the successful check; it is assumed that arrival times of noise pulses are liberally dispersed throughout the array.]

The processing begins on the assumption that the pulse which will arrive next is pulse $P_1$ of a new nibble. Thus index j is initially set equal to 7 to indicate that the first processing will be for case 7. As indicated in the flow chart, the system then waits for the arrival of a new pulse. As soon as it arrives, its arrival time is rounded to the nearest 32 usec and that arrival time is loaded into position 10 of the array. It is assumed that there can be some error in the system timing, and there is no reason to process data with a precision greater than 32 usec. The easiest way to accomplish the rounding is to employ a variation of a well-known technique. Rounding to the nearest 32 usec, which involves either increasing or decreasing the arrival time value, can actually be accomplished by adding 16 usec to every time interval at the transmitter, and then dropping the five least significant bits from the arrival time at the receiver. Consequently, the rounding can be accomplished at the receiver in a highly expeditious manner, and all that is required at the transmitter is to add 16 usec to the time separation between every pair of pulses as otherwise determined by the coding.

The system next sets the index i to a value of 10. The index i points to the arrival time in the array which will be used together with the arrival time of the most recent pulse in order to derive a Delta T value which will be checked to see if it falls within one of the seven possible window limit ranges. All of the array positions have to be checked because not only is it not known which pulse in the nibble the most recent pulse represents ($P_3$, $P_2$, etc.), but it is not even known where in the array the arrival time of the preceding nibble pulse is stored because the array will often contain the arrival times of many noise pulses.

After i is set equal to 10, a DJNZ test is performed. This is the well known "decrement and jump on nonzero" test. Index i is first decremented to a value of 9, to point to the arrival time stored in array position 9, and since i is greater than 0 the processing continues. It is only when i is decremented all the way down to 0 that the system "gives up" and ignores the most recent pulse, having determined that it cannot possibly be the second pulse in any one of the seven cases which can be handled. [As will be described, j is also decremented.]

The upper window limit test is then performed for the case under consideration and the array entry under consideration. Thus far it has been assumed that $j=7$ so that case 7 is the assumed case, and the system operates on the arrival time stored in array position 9, since the first time that i is decremented gives rise to a value of $i=9$. Referring to note 2, the arrival time $A_9$ is subtracted from the most recently entered arrival time $A_{10}$, and the time difference Delta T is derived. This time is compared with the upper limit of 4,992 usec for case 7. If the upper limit is not greater than or equal to Delta T, i.e., the time which elapsed between the pulses whose arrival times are $A_{10}$ and $A_9$ is greater than the maximum time which can elapse between pulses S and $P_1$, the system checks whether the upper limit for case 6 is greater than or equal to the computed time difference since the separation between every $P_1/P_2$ pair is greater than the separation between every $S/P_1$ pair. As the flow chart shows, j is decremented so that case 6 is now assumed. A loop is made back to the upper-limit test, and now the value of 6,016 usec is selected. If the time interval between the last two pulses is too large to correspond with case 6, case 5 is tried. This process continues until j is decremented down to 0. If the time interval which elapsed between the last two received pulses exceeds 15,104 usec, then there is more than one missing pulse and the system gives up. A return is made to the start of the processing. There is no reason to process the arrival times in array positions lower than the current value ($i=9$) and to subtract them from from the arrival time in array position 10 because the Delta T values for these array positions will certainly be larger than the Delta T value computed for the arrival time $A_9$ which gave rise to a time difference so large that it cannot correspond with any one of the seven cases which can be processed. [The numbers stored in the array necessarily get higher with array position since the arrival time values continuously increase and the latest arrival time is always stored in position 10.]

Assume, now, that the upper limit test is passed for some value of j, for example, $j=4$, when $i=9$. The processing is still taking place for the Delta T derived by subtracting the arrival time $A_9$ from the arrival time $A_{10}$. If the pulse which was just detected is pulse $P_4$ of a nibble, corresponding to the $P_4$-$P_3$ interval which is the case 4 under consideration, the Delta T value must be greater than 7,040 usec. This lower limit L. is compared with Delta T following the successful upper-limit test. If Delta T is not greater than this lower limit, then further processing stops for $i=9$. The reason for this is that if Delta T does not fall within the upper and lower bounds for the case 4 window, and since it is less than the upper bound, it cannot possibly fall within the higher-value window ranges for one of the remaining lower-numbered cases. But that does not mean that the system should give up. It simply means that for the time interval under consideration, that corresponding to the difference between the arrival times of the pulses represented in array positions 10 and 9, none of the seven cases which can be processed applies. It is still assumed that the most recent pulse whose arrival time is stored in array position 10 is a legitimate code pulse, but the pulse whose arrival time is $A_9$ may have been noise.

The system now decrements index i and considers the pulse whose arrival time is in position 8 of the array. It will be noted that when the lower limit test for the case j under consideration fails and the system loops back and decrements the value of i, if j has already been decremented down from 7, the processing for $i=8$ does not start with case 7. If j has been decremented down to 4 when the lower limit test fails, for example, it is an indication that the Delta T value derived for $i=9$ is less than 8,064 usec. (The lower limit test is not even performed until after the corresponding upper limit test is passed.) The Delta T for $i=8$ must be greater than 8,064 usec since all arrival times $A_i$ are subtracted from $A_{10}$ and the difference increases as i decreases. Since it is already known from the processing for $i=9$ that Delta T was greater than the upper limit for case 5 (not to mention the upper limits for cases 6 and 7), there is no way that the Delta T for $i=8$ can be less than this upper limit since Delta T increases as i decreases. Consequently, there is no reason to consider higher-numbered cases and the processing can continue still with $j=4$, followed by j being decremented and only the lower-ordered cases being considered. The reason that j begins at the highest value and is decremented is precisely because of this possibility of short-cutting the processing by never having to go back and consider a higher-ordered case once j has been decremented. Put another way, during any processing for a newly arrived pulse, i and j are decremented only. There is no "loop within a loop" processing, with an inner loop beginning all over again after the outer loop is stepped.

The processing continues for the new value of i. One of three things now takes place. First, j can be decremented down to 0, in which case a loop is made back to the start of the processing and nothing is done about the most recent pulse; it is just assumed to be noise and not the second pulse in one of the seven pulse pairs whose cases can be handled. (No matter what the value of i, if the time difference between $A_{10}$ and $A_i$ exceeds 15,014 usec, then the time differences between $A_{10}$ and the arrival times in all lower array positions must also exceed 15,014 usec.) Second, i may be decremented all the way down to 0. This means that there is no Delta T (of the nine possibilities indicated) which falls within the seven possible window ranges, and also in this case the most recent pulse is ignored and the processing returns to the beginning to await the arrival of a new pulse. Third, at some point in the processing, for some value of i and for some value of j, the $L_j$ test is passed. This means that for the case j being processed, and for the pulse represented in position i of the array, the Delta T value falls within the window limits for that case. Simply by consulting the chart for the case corresponding to the current value of j, it is known which nibble pulse is stored in position i of the array and which nibble pulse is stored in position 10 of the array.

What the system requires, of course, is the value of E for this case because E represents the nibble value. The next step in the processing involves a computation of E, and it is a very simple matter. The system has already computed Delta T. According to note 3, the offset (the non-constant part of the pulse separation for the case under consideration) is determined by subtracting the lower window limit $L_j$ for case j from Delta T. Once the offset has been determined, for the reasons described above and as shown in note 4, all that is required is to divide the offset by 64(N) to derive the value of E. The value of N, of course, is determined from the chart as being either 1 or 2 since the case is known.

Once the value of E is determined, there is still no assurance that it is valid. E must be an integer between 1 and 16. If the computed value of E is not within this range, then it is ignored and a return is made to that part of the processing in which i is decremented once again. The pulse arrival time $A_i$ just considered cannot correspond with a legitimate pulse (assuming that the last-received pulse, whose arrival time is $A_{10}$, is also legitimate), so the processing operates on the pulse arrival time in the next lowest array position together with $A_{10}$ to check whether it defines an interval which is valid from a coding standpoint.

Assuming that a valid value of E is computed before j is decremented down to 0 or i is decremented down to 0, the system proceeds to the step described as "update E table and test for valid nibble." Thus far, the most that can be said is that a nibble value has been determined as being represented by one of the seven possible pulse pairs listed in the chart of FIG. 1. That does not mean that it can be said with assurance that that is the value of the data represented by all four pulses (plus the start pulse) which comprise the nibble. The decision logic for whether a valid nibble has been detected is left for the processing depicted in FIG. 3.

Before describing this processing, however, it will be helpful to consider the criteria used for determining whether a valid nibble has been detected; these criteria are depicted in the table of FIG. 2.

The system maintains a 7-entry table called the E table. Each entry is for one of the cases j=1 through j=7. When a valid E determination is made, the E value is stored in position j of the E table, where j is the case under consideration. A nibble which is transmitted and received perfectly contains four time intervals each of which represents the same value of E. Case 7 corresponds with the first interval, case 6 corresponds with the second, case 5 corresponds with the third and case 4 corresponds with the fourth. The three other cases correspond to respective double intervals (two pulses which bracket another which is missing), but a double interval can represent an E value as explained previously. Since case 3, for example, corresponds with an interval $P_2$–S, it is to be expected that during the processing of a given nibble, if a valid E value was derived for case 3, it is hardly likely that a valid E value will be derived for case 6 (since case 3 assumes that the $P_1$ pulse is missing, and the $P_1$ pulse is present for case 6). The E table is simply a table which contains the derived E values for all cases j for which valid values were computed. Theoretically, there should be four entries in the E table as a result of the processing of all pulses in any nibble, which E values are identical. As a practical matter, however, this is unlikely. The basic test for validating a nibble is whether identical E values with a sufficient degree of redundancy appear in the table, corresponding, of course, to a sufficient number of different cases j (three different pulse separation intervals in the illustrative embodiment of the invention).

There are a limited number of possibilities, and they are shown in the chart of FIG. 2. The chart represents the required agreement in the E table (three identical values) for a nibble to be considered valid. The kind of agreement which must be found in the table depends on the last case which was processed, and there are five possibilities in all, three of them corresponding with the case under consideration being represented by j=4.

It will be noted that there is no entry in the chart of FIG. 2 for a "last j" of 7. This is because if during the processing of FIG. 1, j=7 and a valid E value was obtained, it is an indication that the last pulse received was pulse $P_1$ of a nibble. Obviously, a valid nibble has not yet been detected since the basic test is that three E values must match and at most only one E value could possibly have been transmitted thus far on the assumption that the most recent pulse processed was a legitimate $P_1$ pulse. Similarly, there are no entries in the chart of FIG. 2 for j=6 because at most only two pulses have been received thus far. There is an entry for j=5 because it is possible for a nibble to be determined to be valid as soon as three identical E values are computed following receipt of the first three pulses of a 4-pulse (5 pulses if S is counted) nibble. Regardless of the value of E for the fourth pulse separation, the agreement of the first three is all that is required. Of course, there is an entry in the chart of FIG. 2 for j=4 because for this case an entry is made to the E-table processing only on the assumption that pulses $P_4$ and $P_3$ have been detected, and a check must certainly be made to see whether there are a sufficient number of E values in agreement which would represent the correct arrival of the earlier pulses in the nibble. There are no entries in the table of FIG. 2 for cases 3 and 2 because the assumption for these two cases is that the most recent pulse was either $P_2$ or $P_3$, and in each case there is a missing pulse; consequently, there cannot possibly be three matching E values in the table. Finally, for case 1 there is an entry because the assumption is that the most recently arrived pulse was $P_4$ of a nibble, and while pulse $P_3$ was missing, there can still be three matching values.

Figure 3:
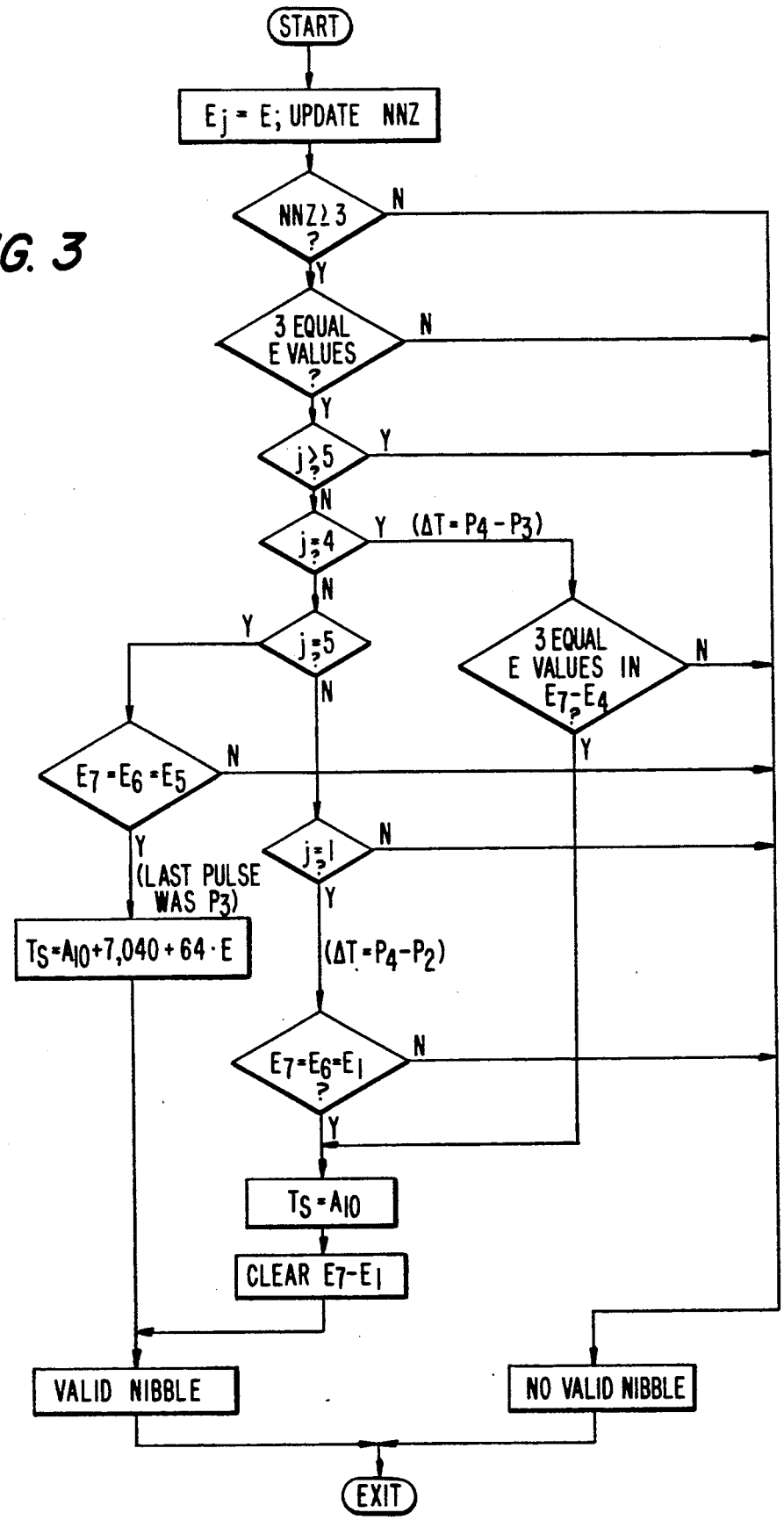
FIG. 3 is an expanded flow chart for the last step depicted in FIG. 1.

Referring to the table, if the most recent pulse represents pulse $P_4$ of a nibble, corresponding to case 4, the value E is contained as $E_4$ in the table; that value is stored as indicated in the last step of the processing of FIG. 1 (the first step in the processing of FIG. 3). The question is whether there are at least two other E values in positions 5, 6 and 7 of the table, corresponding to the first three pulse separations in a nibble, which are the same. As indicated in FIG. 2, all that is required for a valid nibble is that two of the three values $E_5$, $E_6$ and $E_7$ match the value $E_4$. The X in each case represents a "don't care"; what is required for a valid nibble is a 3-out-of-4 agreement.

Case 5 is that for which the last received pulse was pulse $P_3$ of a nibble, with the corresponding interval being $P_3$-$P_2$ In this case, there is no $E_4$ value in the table because theoretically only three legitimate pulses of a nibble have even been received. As indicated in the table, for case 5 what is required to validate a nibble is agreement among $E_5$, $E_6$ and $E_7$.

Finally, case 1 is that for which the last pulse received was $P_4$ of a nibble, but pulse $P_3$ was missing; $E_1$ is the E value computed for the double interval which separated pulses $P_2$ and $P_4$, corresponding to case 1 shown at the top of FIG. 1. Since pulse $P_3$ is assumed to be missing, the only other intervals for which E values could have been computed are those for $P_1$-S and $P_2$-$P_1$, the two time intervals corresponding to cases 6 and 7. Consequently, there must be E values $E_6$ and $E_7$ in the table which match $E_1$, and it is this condition which is shown in FIG. 2 as the validating criterion for a nibble when the current value of j is 1.

The actual processing is shown in FIG. 3. In the first step the E value just computed is stored in location j of the E table, as just described. There is a variable NNZ which represents the number of non-zero E table entries. As will be described below, the table is cleared once it is determined that there is a valid nibble. Whenever a new entry is made in the table, be it the first time that an E value is entered for a particular case or an E value for a particular case is changed, the variable NNZ is updated to represent the total number of non-zero values. A test is then made to see if NNZ is greater than or equal to three. If it is not, it is impossible to determine that a valid nibble has been received and an exit is made from the processing of FIG. 3 back to the start of the processing of FIG. 1. The system simply waits for the arrival of the next pulse.

On the other hand, if the value of NNZ is greater than or equal to three, a test is made whether there are three equal E values. If there are not, a valid nibble determination cannot be made.

Even if there are three equal E values in the table, that is still not sufficient to determine that a valid nibble has been detected because it depends on which three values are equal. A test is first made to see whether j is equal to 6 or 7. If it is, then as described above there should be no three values of E which are equal, and an exit is made from the processing of FIG. 3.

On the other hand, if j is equal to or less than 5, the next step is a test to see whether it is equal to 4. If it is, representing that the last computed time interval Delta T corresponds to the receipt of pulse $P_4$ of a nibble following pulse $P_3$ of a nibble, a check is made to see whether the three equal E values are in positions 4-7 of the E table. As discussed above, there must be agreement among three of these four values (with one of the values being $E_4$). In the absence of agreement, no valid nibble determination can be made.

If for the current case 4 there are three equal E values in positions 4-7 of the E table, FIG. 3 shows a step $TS=A_{10}$. This step really has little to do with the processing under consideration, but it is a useful feature to provide in connection with other processing. Since it is case 4 which has just taken place, it is known that the last pulse which arrived was pulse $P_4$ of a nibble. This pulse is in turn the start pulse of the next nibble. Since there will be at least 3,968 usec before the next pulse $P_1$ is detected (with some tolerance allowed for timing errors), there is really no reason to look for a pulse before that time. Typically, the detection of a pulse results in an interrupt of the controlling microprocessor. It is convenient, therefore, to disable interrupts for slightly under the next 4 milliseconds because all that could be detected during this time is noise anyway. Furthermore, during these 4 milliseconds all of the other processing which may otherwise not be performed while looking for nibble pulses may be undertaken. $T_S$ is simply a variable which represents the arrival time of the last pulse of the preceding nibble, the start pulse of the next nibble. By setting it equal to the arrival time stored in position 10 of the pulse arrival time array, the microprocessor can disable "pulse-arrival" interrupts for the next 4 milliseconds or so.

The next step in the processing is the clearing of the E table. Since a valid nibble has been determined, the E table should be cleared so that a new nibble can be processed. The "valid nibble" step which is next simply sets a flag if the system in which the communication system of our invention is used has to be informed of the receipt of a valid nibble. An exit is then made from the processing of FIG. 3. As shown at the bottom of the flow chart of FIG. 1, this exit causes a return to the start of the processing where j is set equal to 7 and the system waits for the arrival of a new pulse.

Referring back to FIG. 3, thus far the case of j=4 has been considered. If j is not equal to 4, a test is made to see if j=5. If j does not equal 5, the last possibility for there to be a valid nibble is if j=1. If this test fails as well, a valid nibble determination cannot be made, as indicated. As in every case when a valid nibble cannot be determined, a "no valid nibble" flag can be set, and a return is made to the top of FIG. 1 to wait for the arrival of another pulse. On the other hand, if j=1, the case under consideration is that for which the last received pulse resulted in a Delta T computation which represents the time interval between pulses $P_2$ and $P_4$ of a nibble. According to the chart of FIG. 2, for j=1 there must be agreement among the entries in the E table for positions 1, 6 and 7, and this is the next test which is performed. If there is no agreement among these three E values, no valid nibble has been determined.

On the other hand, if there is agreement, exactly the same processing takes place as in the case of j=4, since once again it is pulse $P_4$ which has just been detected.

The last case to consider is that in which j=5. The test according to the chart of FIG. 2 is whether the E values in the table at positions 5, 6 and 7 are in agreement. If not, then as shown in the flow chart of FIG. 3 a valid nibble determination cannot be made. But if there is agreement, what it means is that the last pulse, the one which has just been processed, was pulse $P_3$ of a nibble. That is because case 5 corresponds to a $P_3$-$P_2$ time interval. Pulse $P_4$ is yet to be received. It is actually advantageous to ignore this pulse and to perform no processing for it. Since three pulse intervals have already agreed, there is nothing to be gained by checking whether the $P_4$-$P_3$ interval is also in agreement; even if it is not in agreement with the first three, it will not change things. Instead, all pulse processing should cease until the arrival time of pulse $P_1$ in the next nibble. But it is necessary for the system to store the arrival time of the start pulse for the next nibble since it is assumed that the microprocessor ignores incoming pulses until slightly under 3,968 usec have elapsed following the arrival time of the start pulse ($T_S$), as discussed above. What is necessary is to compute the start time of the next nibble, even though pulse $P_4$ of the current nibble has not yet arrived.

The arrival time of $P_3$ is in position 10 of the A array. The time between pulses $P_3$ and $P_4$ is simply 7,040+64(E), and the value of E has just been determined. Consequently, it is possible to compute the value of $T_S$ as indicated in the flow chart of FIG. 3, even though pulse $P_4$ has not yet arrived. After $T_S$ is computed and the valid nibble flag is set, an exit is made in the usual fashion from the flow chart of FIG. 3.

There are several observations to be made about the processing just discussed. The pulse array (the array which represents pulse arrival times) is 10 deep. Thus it can accommodate the arrival times of the five legitimate pulses of a nibble as well as the arrival times of five noise pulses. More noise can be tolerated if a larger array is provided.

Perhaps most important is to understand the philosophy behind the processing. Whenever a pulse is received, it is assumed that nothing is known about it except that it is considered to be one of the pulses which constitute a nibble. The arrival time of this pulse is compared with the arrival times of all other pulses in the array in order to determine whether the time separation between this last pulse and one of the nine earlier ones corresponds with a legitimate pulse separation (one of four possible constant values plus one of sixteen possible offsets, taking into account that double pulse separations must be considered for the cases of missing pulses). The latest entry is ignored if this gross scanning fails. But if the gross scanning (large window test) is successful, then the processing goes deeper to see whether an entire nibble can be reconstructed. By going deeper is meant checking whether there are sufficient E values stored in the E table which would allow verification of the latest pulse as being $P_3$ or $P_4$, with sufficient agreement already being represented to warrant consideration of a valid nibble having arrived. In other words, the E values represented by a sufficient number of different pulse pair positions in a nibble ($P_1/P_2$, $P_2/P_3$, etc.) must agree before it is assumed that valid data has been received.

There is no need to know which pulse is the start pulse. The advantage of knowing which pulse is at the start of a nibble (relating to the computation of $T_S$ described above) is that interrupts can be disabled until shortly before the first possible receipt of a $P_1$ pulse of a new nibble. But even if this step is omitted, it is not necessary ever to know when a nibble begins. What is really being done is to sense the end of a nibble (or pulse $P_3$ near the end) and then to go back and see if there is enough redundancy present to warrant making a nibble determination. The end of a nibble can be distinguished from the beginning of a nibble, of course, because the pulse separations get progressively longer toward the end of a nibble even though the offsets remain the same. This is not to say that the offsets cannot change along with the constant components, nor does it mean that the intervals have to increase rather than decrease from the beginning to the end of a nibble. What is necessary, however, is that there be a pattern in pulse separations which is independent of actual data values and which can be discerned even in the presence of noise.

Although the invention has been described with reference to a particular embodiment it is to be understood that this embodiment is merely illustrative of the application of the principles of the invention. Numerous modifications may be made there and other arrangements may be devised without departing from the spirit and scope of the invention.

We claim:

1. A method of redundantly transmitting a selected one of a plurality of data values over an infra-red link comprising the steps of:
   (a) selecting a single data value which is to be transmitted, and
   (b) transmitting a sequence of infra-red pulses separated by different time intervals, the sequential pulses being separated by time intervals which are all different functions of said same single data value, all of said time intervals representing said same single data value.

2. A method of transmitting data over an infra-red ink in accordance with claim 1 wherein each time interval separating two successive pulses has a duration which is the sum of a part which is constant and is independent of the data value being transmitted, and a part which is variable and is dependent on the data value being transmitted, with the constant parts of the successive time intervals during the redundant transmission of any data value changing in the same direction.

3. A method of transmitting data over an infra-red link in accordance with claim 2 wherein the variable part of every time interval separating two successive pulses during the redundant transmission of any data value is the same and is a function of only said data value.

4. A method of transmitting data over an infra-red link in accordance with claim 3 wherein all of said constant and variable time interval parts are such that the entire set of time intervals which can separate any two successive pulses have values which are non-overlapping with the values of all others of such sets.

5. A method of transmitting data over an infra-red link in accordance with claim 2 wherein all of said constant and variable time interval parts are such that the entire set of time intervals which can separate any two successive pulses have values which are non-overlapping with the values of all others of such sets.

6. A method of transmitting data over an infra-red link in accordance with claim 1 wherein the entire set of time intervals which can separate any two successive pulses have values which are non-overlapping with the values of all others of such sets.

7. A method of decoding a selected one of a plurality of data values received over an infra-red link, the selected data value having been transmitted redundantly in the form of a sequence of infra-red pulses with sequential pulses being separated by different time intervals which are all different functions of said selected data value, and wherein the entire set of time intervals which can separate any two successive pulses in said sequence have values which are non-overlapping with the values of all others of such sets, comprising the steps of:

(a) storing in an array entries representing the arrival times of all received pulses, whether such pulses were transmitted or are the result of noise, (b) deriving from pairs of the array entries, while treating all represented arrival times as corresponding to transmitted pulses, possible pulse arrival time differences and checking whether such time differences fall within ranges of sets of time intervals which can separate successively transmitted pulses in said sequence, (c) responsive to a successful check for a time difference in sub-step (b), deriving from such time difference the data value which could have caused an associated pair of pulses to be separated by such time difference, (d) recording the data value derived in substep (c) and associating it with the position of a pair of pulses in a transmitted sequence whose set of time interval separations includes the time difference which gave rise to said successful check, and (e) determining the receipt of a valid data value when a sufficient number of identical data values have been recorded and have been associated with a sufficient number of different pulse pair positions.

8. A method of decoding data received over an infra-red link in accordance with claim 7 wherein in step (b) checks are also made whether possible pulse arrival time differences fall within the ranges of sets of time interval separations which correspond to pairs of transmitted pulses which bracket another in said sequence, and in step (c) there is derived from such a time difference which gave rise to a successful check the data value which could have caused two respective pulses which bracket another to be separated by such time difference.

9. A method of decoding data received over an infra-red link in accordance with claim 8 wherein in step (e) the receipt of a valid data value can be determined even before the last pulse in a sequence has arrived if said sufficient number of identical data values have been recorded and have been associated with a sufficient number of different pulse pair positions.

10. A method of decoding data received over an infra-red link in accordance with claim 9 wherein the last pulse in one pulse sequence is treated as the first in the next pulse sequence.

11. A method of decoding data received over an infra-red link in accordance with claim 10 wherein following a determination made in step (e), entries representing pulse arrival times are not stored in said array in step (a) until just prior to when the first pulse of the next pulse sequence could possibly arrive.

12. A method of decoding data received over an infra-red link in accordance with claim 8 wherein the last pulse in one pulse sequence is treated as the first in the next pulse sequence.

13. A method of decoding data received over an infra-red link in accordance with claim 8 wherein following a determination made in step (e), entries representing pulse arrival times are not stored in said array in step (a) until just prior to when the first pulse of the next pulse sequence could possibly arrive.

14. A method of decoding data received over an infra-red link in accordance with claim 7 wherein in step (e) the receipt of a valid data value can be determined even before the last pulse in a sequence has arrived if said sufficient number of identical data values have been recorded and have been associated with a sufficient number of different pulse pair positions.

15. A method of decoding data received over an infra-red link in accordance with claim 7 wherein the last pulse in one pulse sequence is treated as the first in the next pulse sequence.

16. A method of decoding data received over an infra-red link in accordance with claim 15 wherein following a determination made in step (e), entries representing pulse arrival times are not stored in said array in step (a) until just prior to when the first pulse of the next pulse sequence could possibly arrive.

17. A method of decoding data received over an infra-red link in accordance with claim 7 wherein following a determination made in step (e), entries representing pulse arrival times are not-stored in said array in step (a) until just prior to when the first pulse of the next pulse sequence could possibly arrive.

18. A method of decoding data received over an infra-red link in accordance with claim 7 wherein all of said steps are performed without first requiring knowledge of which received pulse is the first in a sequence.

19. A method of decoding a signal received over an infra-red link, the signal representing a selected one of a plurality of data values and being redundantly transmitted in the form of a sequence of infra-red pulses with the sequential pulses being separated by respective time intervals which are functions of the same data value, comprising the steps of:

(a) storing information representative of the arrival times of all received pulses, whether such pulses were transmitted or are the result of noise, (b) deriving from pairs of represented arrival times, while treating all represented arrival times as corresponding to transmitted pulses, possible pulse arrival time differences and checking whether such time differences are consistent with the time intervals which are allowed to separate successively transmitted pulses in said sequence in accordance with the coding scheme employed for the data, (c) responsive to a successful check for a time difference in sub-step (b), deriving from such time difference the data value which could have caused the associated pair of pulses to be separated by such time difference, (d) recording the data value derived in substep (c), and (e) determining the receipt of a valid data value when a sufficient degree of redundancy has been recorded in step (d).

20. A method of decoding a signal received over an infra-red line in accordance with claim 19 wherein all of said steps are performed without first requiring knowledge of which received pulse is the first in a sequence.

21. A method of decoding a signal received over an infra-red link in accordance with claim 20 wherein step (d) further includes associating a recorded data value with the position of a pair of pulses in a transmitted sequence with whose allowed time interval separations the time difference which gave rise to said successful check is consistent, and in step (e) a determination is made of the receipt of a valid data value only when a sufficient number of identical data values have been recorded and have been associated with a sufficient number of different pulse pair positions.

22. A method of decoding a signal received over an infra-red link in accordance with claim 21 wherein in step (d) the pairs of pulses whose positions are subject to association include adjacent pulses in a sequence and pulses which bracket another in a sequence.

23. A method of decoding a signal received over an infra-red link in accordance with claim 22 wherein in step (e) the receipt of a valid data value can be determined even before the last pulse in a sequence has arrived if said sufficient number of identical data values have been recorded and have been associated with a sufficient number of different pulse pair positions.

24. A method of decoding a signal received over an infra-red link in accordance with claim 23 wherein the last pulse in one pulse sequence is treated as the first in the next pulse sequence.

25. A method of decoding a signal received over an infra-red link in accordance with claim 24 wherein following a determination made in step (e), information representative of pulse arrive times is not stored in step (a) until just prior to when the first pulse of the next pulse sequence could possibly arrive.

26. A method of decoding a signal received over an infra-red link in accordance with claim 20 wherein in step (e) the receipt of a valid data value can be determined even before the last pulse in a sequence has arrived if said sufficient number of identical data values have been recorded and have been associated with a sufficient number of different pulse pair positions.

27. A method of decoding a signal received over an infra-red link in accordance with claim 20 wherein the last pulse in one pulse sequence is treated as the first in the next pulse sequence.

28. A method of decoding a signal received over an infra-red link in accordance with claim 20 wherein following a determination made in step (e), information representative of pulse arrival times is not stored in step (a) until just prior to when the first pulse of the next pulse sequence could possibly arrive.

29. A method of decoding a signal received over an infra-red link in accordance with claim 19 wherein step (d) further includes associating a recorded data value with the position of a pair of pulses in a transmitted sequence with whose allowed time interval separations the time difference which gave rise to said successful check is consistent, and in step (e) a determination is made of the receipt of a valid data value only when a sufficient number of identical data values have been recorded and have been associated with a sufficient number of different pulse pair positions.

30. A method of decoding a signal received over an infra-red link in accordance with claim 29 wherein in step (d) the pairs of pulses whose positions are subject to association include adjacent pulses in a sequence and pulses which bracket another in a sequence.

31. A method of decoding a signal received over an infra-red link in accordance with claim 19 wherein in step (e) the receipt of a valid data value can be determined even before the last pulse in a sequence has arrived if said sufficient number of identical data values have been recorded and have been associated with a sufficient number of different pulse pair positions.

32. A method of decoding a signal received over an infra-red link in accordance with claim 19 wherein the last pulse in one pulse sequence is treated as the first in the next pulse sequence.

33. A method of decoding a signal received over an infra-red link in accordance with claim 19 wherein following a determination made in step (e), information representative of pulse arrival times is not stored in step (a) until just prior to when the first pulse of the next pulse sequence could possibly arrive.

* * * * *